(12) United States Patent
Zijlstra

(10) Patent No.: US 7,932,560 B2
(45) Date of Patent: Apr. 26, 2011

(54) METHOD OF FABRICATING A SEMICONDUCTOR ON INSULATOR DEVICE HAVING A FRONTSIDE SUBSTRATE CONTACT

(75) Inventor: Piebe A. Zijlstra, Middellar (NL)

(73) Assignee: NXP B.V., Eindhoven (NL)

( * ) Notice: Subject to any disclaimer, the term of this patent is extended or adjusted under 35 U.S.C. 154(b) by 285 days.

(21) Appl. No.: 12/160,782

(22) PCT Filed: Jan. 10, 2007

(86) PCT No.: PCT/IB2007/050077
§ 371 (c)(1),
(2), (4) Date: Jul. 12, 2008

(87) PCT Pub. No.: WO2007/080545
PCT Pub. Date: Jul. 19, 2007

(65) Prior Publication Data
US 2010/0163993 A1 Jul. 1, 2010

(30) Foreign Application Priority Data
Jan. 12, 2006 (EP) ................................. 06100281

(51) Int. Cl.
*H01L 27/12* (2006.01)

(52) U.S. Cl. ............... 257/347; 257/E27.112; 438/149; 438/479; 438/517

(58) Field of Classification Search ................ 257/347
See application file for complete search history.

(56) References Cited

U.S. PATENT DOCUMENTS

| 5,194,395 A * | 3/1993 | Wada ........................... 438/143 |
| 2002/0115244 A1 | 8/2002 | Park et al. |
| 2005/0176184 A1 | 8/2005 | Okihara |
| 2005/0236712 A1 | 10/2005 | Tsao et al. |

FOREIGN PATENT DOCUMENTS

| EP | 1193760 A | 4/2002 |
| JP | 6151576 | 7/2008 |

* cited by examiner

*Primary Examiner* — Ajay K Arora

(57) ABSTRACT

A method of forming a substrate contact in a semiconductor device, comprising the steps of providing a semiconductor base substrate (2) having a buried oxide (BOX) layer (4) and a thin active semiconductor layer (103) on the BOX layer (4), forming a trench (104) in the active semiconductor layer (103) and the Box layer (4) to the semiconductor base substrate (2) below, and then depositing another active semiconductor (epitoxial) layer (6) over the remaining active semiconductor layer (103) and in the trench (104) to create the substrate contact. The trench (104) is etched at a location on the wafer corresponding to a scribe lane (106).

17 Claims, 4 Drawing Sheets

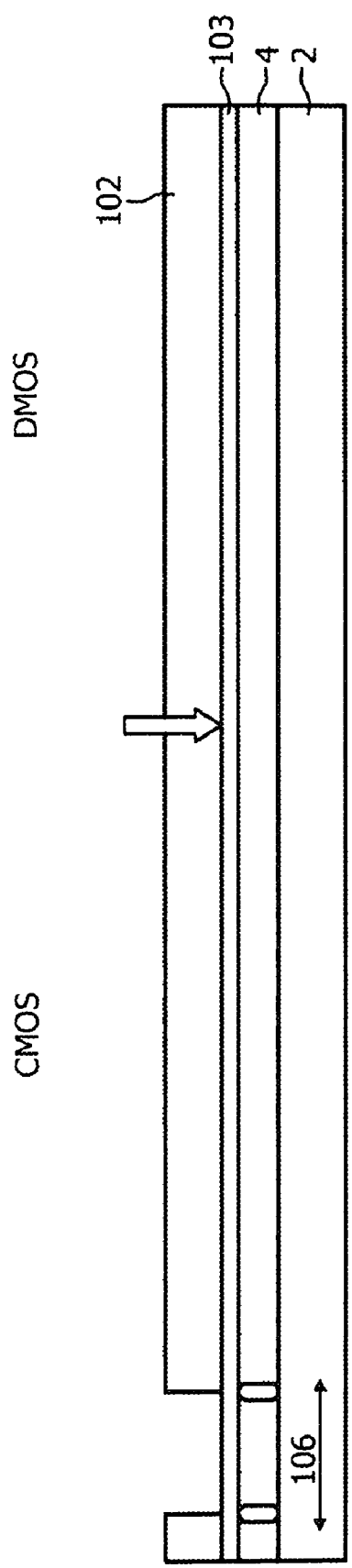
FIG. 2a
FIG. 2b

METHOD OF FABRICATING A SEMICONDUCTOR ON INSULATOR DEVICE HAVING A FRONTSIDE SUBSTRATE CONTACT

The invention relates to a method of fabricating a semiconductor on insulator (SOI) device having a frontside substrate contact.

It is often desirable, to completely electrically insulate an active semiconductor device both from the underlying semiconductor substrate and from neighboring active devices.

Vertical isolation of active devices is generally achieved by the use of a semiconductor-on-insulator (SOI) substrate which, referring to FIG. 1 of the drawings, comprises a base semiconductor (typically silicon) substrate 2 with a buried insulator (typically silicon oxide) or BOX layer 4 formed on its upper surface, and an active bonded semiconductor (typically silicon) layer 6 formed on the BOX layer 4. Active devices (transistors) are fabricated in the active semiconductor layer 6 on top of the insulating layer 4.

In many applications, it is required to ground or bias the base semiconductor substrate 2, and for this a contact to the substrate 2 is required. There are two general solutions proposed in this regard: frontside and backside contacts, both of which configurations are generally known in the art.

Backside contacts, whereby the contact is provided to the substrate 2 from the rear side of the wafer (opposite to the active layer 6) after the active device has been processed may lack speed performance (especially in HV applications) due to charging and discharging of electrical charge underneath the BOX via the substrate. Frontside contacts, on the other hand, whereby a contact is provided from the front or upper surface of the wafer to the base substrate 2 via the active layer 6 and the BOX layer 4, as illustrated in, for example, Japanese patent application No. 6-151576. However, one of the principal drawbacks of this option is the deep contact etch because it is mostly done at the end of the process flow.

It is therefore an object of the invention to provide a method of manufacturing a semiconductor on insulator (SOI) device having a frontside substrate contact, wherein the contact etch required to create the frontside substrate contact is significantly simplified relative to prior art methods.

In accordance with the present invention, there is provided a method of fabricating a semiconductor-on-insulator device, the method comprising providing a semiconductor wafer comprising a semiconductor base substrate having a layer of insulating material thereon and a first active semiconductor layer on said layer of insulating material, wherein at least one scribe lane is provided on said wafer, the method further comprising forming a substrate contact by creating an opening in said first and live semiconductor layer and said layer of insulating material to said base substrate at a location on said wafer corresponding to said at least one scribe lane and subsequently depositing a second active semiconductor layer over said first active semiconductor layer and in said opening.

Thus, the above-mentioned object is achieved by creating an opening in the first (relatively thin) active semiconductor layer at a location corresponding to a scribe lane before the second active semiconductor (epitaxial) layer is deposited, so that the opening is subsequently filled with semiconductor material at the time of depositing the second active semiconductor layer to form a substrate contact. A gettering site is beneficially formed in the substrate contact region of the active semiconductor layer.

The opening may comprise a trench. Alternatively, the opening may comprise a contact hole and, more preferably, said opening may comprise an array of contact holes.

The present invention extends to an integrated circuit formed on a semiconductor wafer comprising a semiconductor base substrate having a layer of insulating material thereon and a first active semiconductor layer on said layer of insulating material, said semiconductor wafer having at least two die pads formed thereon, said at least two die pads being separated by at least one scribe lane, wherein a substrate contact is formed in said layer of insulating material at a location on said wafer corresponding to said at least one scribe lane by creating an opening in said first active semiconductor layer and said layer of insulating material to said base substrate and subsequently depositing a second active semiconductor layer over said first active semiconductor layer and in said opening, wherein one or more semiconductor devices are formed in said active layer after formation of said substrate contact.

In the (typical) case, wherein one or more scribe lanes are provided around said semiconductor wafer, a corresponding ring-shaped substrate contact may thus be provided in respect thereof.

These and other aspects of the present invention will be apparent from, and elucidated with reference to, the embodiments described herein.

Embodiments of the present invention will now be described by way of examples only and with reference to the accompanying drawings, in which:

FIGS. 2a to 2d are schematic cross-sectional views of various stages of fabrication of a semiconductor device fabricated in accordance with an exemplary embodiment of the present invention.

Referring to FIG. 2a of the drawings, a device fabrication method according to an exemplary embodiment of the present invention starts with a semiconductor (typically silicon) base substrate 2 having a buried oxide (BOX) layer 4 thereon, on which is provided a thin Si layer 103. The BOX layer typically comprises silicon oxide. A resist layer is provided over the Si layer 103 and subsequently patterned. Next, a trench (or array of contact of holes) is etched through the thin Si layer 103 and BOX layer 4 at the location of a scribe lane 106, as shown in FIG. 2b (with the base substrate 2 omitted for simplicity).

Figure 3:
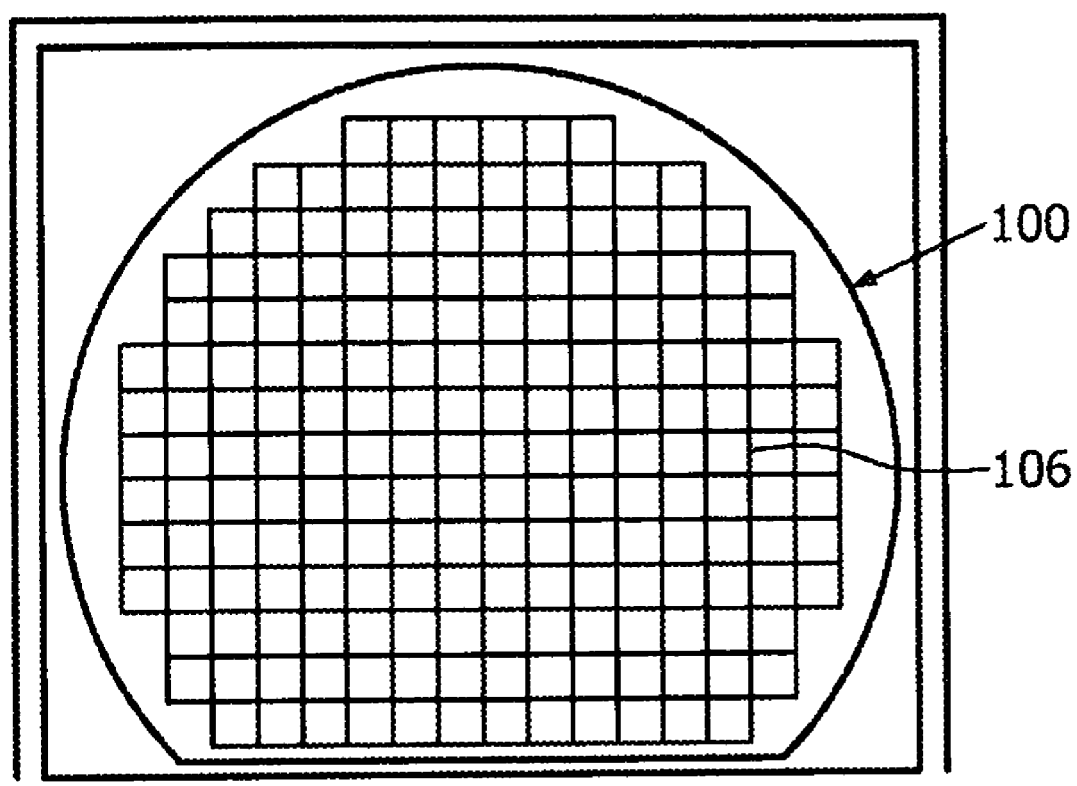
FIG. 3 is a schematic illustration of a semiconductor wafer having scribe lanes therein.

Referring to FIG. 3 of the drawings, scribe lanes 106 are fairly wide lines that run horizontally and vertically across a semiconductor wafer 100. They typically form a regular grid inside the round area of the wafer 100 and do not extend to the edges.

Figure 1:
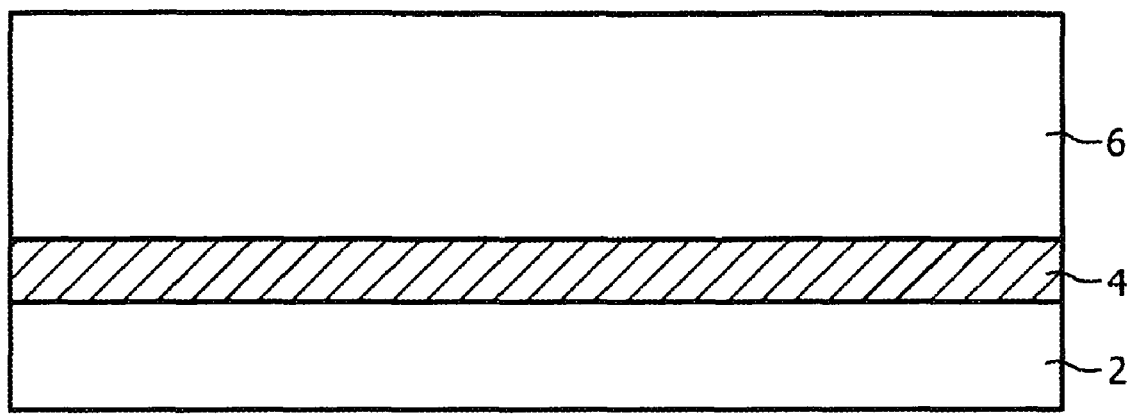
FIG. 1 is a schematic cross-sectional view of a semiconductor-on-insulator (SOI) substrate.
Figure 2C:
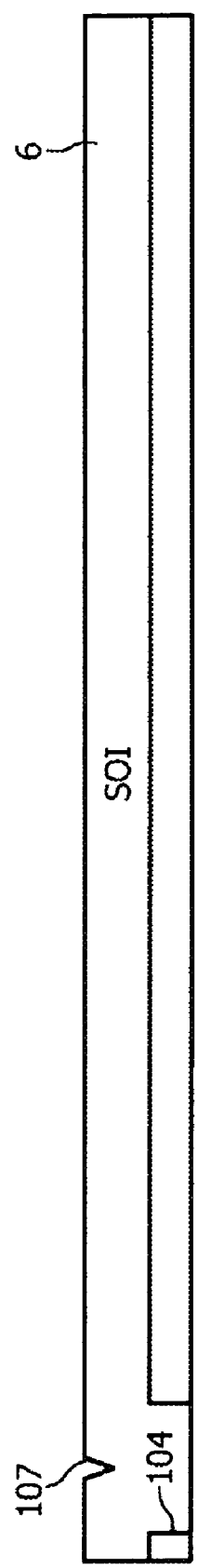

Subsequently, and referring to FIG. 2c of the drawings, the mark layer 102 is removed and an active semiconductor layer 6 is deposited by means of, for example, an epitaxy process. The active layer 6 (e.g. 1.3 μm) may be Si, Si—Ge, Si—Ge—C, or any other suitable semiconductor material and, in one exemplary embodiment, may be P doped to provide an Nwell background for the device. A notch-type structure 107 is located in the active semiconductor layer 6 over the scribe lane 106. Thus, in accordance with the present invention, a substrate contact is created within a scribe lane at the beginning of the process and, in this manner, a ring-shaped (guard-ring) substrate contact surrounding the integrated circuit or wafer can be obtained, if required (depending on the width of the trench and scribe lane).

Gettering is defined as the process of removing device-degrading impurities from the active circuit regions of the wafer. Gettering, which can be performed during crystal growth or in subsequent wafer fabrication steps, is an important ingredient for enhancing the yield of VLSI manufacturing. The general mechanism by which gettering removes impurities from device regions may be described by the following steps: 1) the impurities to be gettered are released into solid solution from whatever precipitate they're in; 2) they undergo diffusion through the silicon; 3) they are trapped by defects such as dislocations or precipitates in an area away from device regions. There are two general classifications of gettering, namely, extrinsic, and intrinsic. Extrinsic gettering refers to gettering that employs external means to create the damage or stress in the silicon lattice in such a way that extended defects needed for trapping impurities are formed. These chemically reactive trapping sites are usually located at the wafer backside.

Intrinsic gettering refers to gettering that involves impurity trapping sites created by precipitating supersaturated oxygen out of the silicon wafer. The precipitation of supersaturated oxygen creates clusters that continuously grow, introducing stress to the wafer as this happens.

Eventually these stresses reach the point where they need to be relieved. Dislocation loops or stacking faults are thus formed to provide the necessary stress relief. These dislocations and faults subsequently serve as trapping sites for impurities.

Thus, as an additional advantage of the present invention, the diffusion and precipitation of impurities in the SOI layer is no longer blocked by the BOX but extend to the base substrate, and moreover very early in the process flow.

Figure 2D:
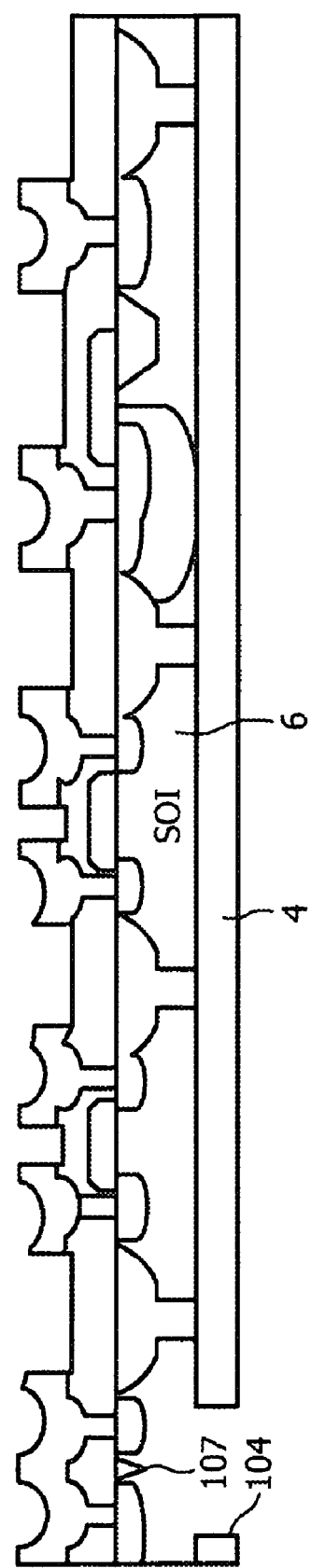

Once the substrate contact has been created, the remaining device process steps can be performed as normal to produce a complete semiconductor device, as illustrated in FIG. 2d.

To summarize, advantages afforded by the method of the present invention include:
  the inclusion of mechanical stress relief in respect of the wafer (to compensate for bow, warpage);
  significant increase in the gettering behavior;
  providing the possibility to grow different material epitaxy layers rather than just Si, such as Si—Ge or Si—Ge—C etc; and
  a substrate contact in the shape of a guard ring around the die can be automatically generated.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented, by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of fabricating a semiconductor-on-insulator device, the method comprising:
  providing a semiconductor wafer comprising a semiconductor base substrate having a layer of insulating material thereon and a first active semiconductor layer on said layer of insulating material, wherein at least one scribe lane is provided on said wafer; and
  forming a substrate contact by creating an opening in said first active semiconductor layer and said layer of insulating material to said base substrate at a location on said wafer corresponding to said at least one scribe lane and subsequently depositing a second active semiconductor layer over said first active semiconductor layer and said insulating layer and in said opening.

2. A method according to claim 1, further including forming a gettering corridor in the substrate contact region from the second active semiconductor layer to the base substrate.

3. A method according to claim 1, wherein said opening comprises a trench.

4. A method according claim 1, wherein said opening comprises a contact hole.

5. A method according to claim 4,
  further including forming an array of contact holes in said first active semiconductor layer and said layer of insulating material to said base substrate at a location corresponding to said at least one scribe lane, and
  wherein depositing said second active semiconductor layer includes depositing the second active layer in said array of contact holes.

6. A method according to claim 1, further including using active material over the contact region to diffuse impurities from the second active semiconductor layer to the base substrate.

7. A method according to claim 1, further including using active material over the contact region to precipitate impurities from the second active semiconductor layer to the base substrate.

8. A method of fabricating a semiconductor-on-insulator device, the method comprising:
  providing a semiconductor wafer comprising a semiconductor base substrate having a layer of insulating material thereon and a first active semiconductor layer on said layer of insulating material, wherein at least one scribe lane is provided on said wafer:
  forming a substrate contact by creating an opening in said first active semiconductor layer and said layer of insulating material to said base substrate at a location on said wafer corresponding to said at least one scribe lane and subsequently depositing a second active semiconductor layer over said first active semiconductor layer and said insulating layer and in said opening;
  forming an array of contact holes that extend through the first active semiconductor layer and the layer of insulating material to the base substrate, in the at least one scribe lane, and
  wherein depositing the second active semiconductor layer includes depositing the second active layer extending through and contacting the first active semiconductor layer, in the array of contact holes.

9. A method of fabricating a semiconductor-on-insulator device, the method comprising:
  providing a semiconductor wafer comprising a semiconductor base substrate having a layer of insulating material thereon and a first active semiconductor layer on said layer of insulating material, wherein at least one scribe lane is provided on said wafer;
  forming a substrate contact by creating an opening in said first active semiconductor layer and said layer of insulating material to said base substrate at a location on said wafer corresponding to said at least one scribe lane and subsequently depositing a second active semiconductor layer over said first active semiconductor layer and said insulating layer and in said opening; and wherein depositing a second active semiconductor layer includes depositing the second active semiconductor layer along sidewalls of the opening defined by the first active semiconductor layer, to connect the first active semiconductor layer and portions of the second active semiconductor layer over the first active semiconductor layer to the substrate.

10. A method of fabricating a semiconductor-on-insulator device, the method comprising:

providing a semiconductor wafer comprising a semiconductor base substrate having a layer of insulating material thereon and a first active semiconductor layer on said layer of insulating material, wherein at least one scribe lane is provided on said wafer;

forming a substrate contact by creating an opening in said first active semiconductor layer and said layer of insulating material to said base substrate at a location on said wafer corresponding to said at least one scribe lane and subsequently depositing a second active semiconductor layer over said first active semiconductor layer and said insulating layer and in said opening; and wherein depositing a second active semiconductor layer includes forming a gettering corridor connecting the first and second active layers to the base substrate in the substrate contact region.

11. An integrated circuit device comprising:

a semiconductor wafer having at least two die pads formed thereon and separated by at least one scribe lane;

a semiconductor base substrate;

a layer of insulating material on the base substrate;

a first active semiconductor layer on the layer of insulating material;

a second active semiconductor layer over said first active semiconductor layer and in an opening extending through the first active semiconductor layer and the layer of insulating material to the base substrate at a location on the wafer corresponding to the at least one scribe lane, the portion of the second active semiconductor layer extending to the base substrate forming a substrate contact; and at least one semiconductor device in said second active semiconductor layer.

12. The device of claim 11, wherein the scribe lane surrounds at least a portion of an integrated circuit in the second active semiconductor layer, and the substrate contact is a ring-shaped substrate contact in the scribe lane.

13. The device of claim 11, wherein the substrate contact is configured and arranged to diffuse impurities from the second active semiconductor layer to the base substrate.

14. The device of claim 11, wherein the substrate contact is configured to precipitate impurities from the second active semiconductor layer to the base substrate.

15. The device of claim 11, wherein the second active semiconductor layer extends to the base substrate through an array of contact holes that extend through the first active semiconductor layer and the layer of insulating material to the base substrate, in the at least one scribe lane.

16. The device of claim 11, wherein the second active semiconductor layer extends along sidewalls of an opening defined by the first active semiconductor layer, to connect the first active semiconductor layer and portions of the second active semiconductor layer over the first active semiconductor layer to the substrate.

17. The device of claim 11, wherein the second active semiconductor layer is configured to form a gettering corridor connecting the first and second active layers to the base substrate in the substrate contact region.

* * * * *